United States Patent [19]

Smith

[11] Patent Number: 4,499,119
[45] Date of Patent: Feb. 12, 1985

[54] METHOD OF MANUFACTURING SUPER-CONDUCTIVE TUNNEL JUNCTION DEVICES WITH PRECISE JUNCTION AREA CONTROL

[75] Inventor: Lawrence N. Smith, Lexington, Mass.

[73] Assignee: Sperry Corporation, New York, N.Y.

[21] Appl. No.: 511,354

[22] Filed: Jul. 6, 1983

[51] Int. Cl.³ .................... H01L 39/24; H01L 39/22
[52] U.S. Cl. ........................ 427/63; 427/99; 427/250; 427/255.4; 427/255.7; 427/282; 427/404; 427/419.2; 156/643; 156/646; 156/649; 156/656; 156/661.1; 204/15; 204/38 B; 204/192 E; 29/578
[58] Field of Search .............. 156/643, 646, 649, 656, 156/661.1; 427/62, 63, 99, 250, 255.4, 255.7, 282, 404, 419.2; 204/15, 38 B, 192 E; 29/578

[56] References Cited

U.S. PATENT DOCUMENTS

| | | | |
|---|---|---|---|
| 4,358,340 | 11/1982 | Fu | 156/656 |
| 4,421,785 | 12/1983 | Kroger | 427/63 |
| 4,432,134 | 2/1984 | Jones | 427/62 |

OTHER PUBLICATIONS

Prober et al., Appl. Phys. Lett. 37(1), Jul. 1, 1980, pp. 94-96.
Speidell, J. Vac. Sci. Technol., 19(3), Sep./Oct., 1981 pp. 693-695.
Flanders et al., J. Vac. Sci. Technology, 19(4), Nov./Dec., 1981, pp. 892-896.

*Primary Examiner*—Norman Morgenstern
*Assistant Examiner*—Richard Bueker
*Attorney, Agent, or Firm*—Howard P. Terry; Albert B. Cooper

[57] ABSTRACT

Superconductive tunnel junctions are manufactured with precise junction areas by defining a narrow-line junction of precise width utilizing a narrow-line mask of precise width and thereafter applying a second narrow-line mask of precise width at an angle to the narrow-line junction to define a junction area with dimensions precisely controlled by the widths of the narrow-line masks. "Edge lithography" is preferably utilized to provide the narrow-line masks.

36 Claims, 21 Drawing Figures

4,499,119

METHOD OF MANUFACTURING SUPER-CONDUCTIVE TUNNEL JUNCTION DEVICES WITH PRECISE JUNCTION AREA CONTROL

BACKGROUND OF THE INVENTION

1. Field of the Invention

The invention relates to superconductive circuits particularly with respect to superconductive tunnel junction devices.

2. Description of the Prior Art

A process for fabricating superconductive tunnel junction circuits is disclosed in a paper by H. Kroger, L. N. Smith and D. W. Jillie, entitled "Selective Niobium Anodization Process for Fabricating Josephson Tunnel Junctions" in the Applied Physics Letters, Volume 39, No. 3, Aug. 1, 1981, page 280. Further details of the process may be found in pending U.S. patent application Ser. No. 179,311, filed Aug. 18, 1980 entitled "Superconductive Tunnel Junction Device and Method of Manufacture", by Harry Kroger and assigned to the assignee of the present invention, now U.S. Pat. No. 4,421,785. The process involves forming a sandwich comprising a lower superconductive layer, a barrier layer and an upper superconductive layer, preferably in situ in the same pump down of the vacuum system. Tunnel junctions are then formed in the sandwich by masking the upper superconductive layer by, for example, photoresistive material or an insulating mask such as silicon dioxide and converting the exposed portions of the upper superconductive layer to insulating material. Alternatively, all or a portion of the barrier layer underlying the exposed areas of the upper superconductive layer may also be converted. The lower superconductive layer remains substantially unconverted to insulation. The conversion to insulation is preferably performed by anodization or alternatively by oxidation.

In the process disclosed in said Applied Physics Letters and in said U.S. Ser. No. 179,311, accurate control of the area of small superconductive junctions (less than or approximately equal to one square micrometer) utilizing standard planar lithographic techniques was difficult to achieve. Additionally, maintaining the accuracy and uniformity of the area of larger junctions (several microns on a side) was difficult to achieve utilizing standard planar lithography. For example, in order to achieve area uniformity of ±5% in junctions having lateral dimensions of 2.5 microns, control of the lateral dimensions to within ±2.5% or 0.06 microns is required. Such precise dimensional control is very difficult to accomplish with the method of said Applied Physics Letters and said U.S. Ser. No. 179,311 when utilizing standard planar lithography.

SUMMARY OF THE INVENTION

The present invention achieves accurate area and dimensional control of superconductive junctions by utilizing a sequence of anodization or oxidation masks for defining the junction dimensions in the process of said Applied Physics Letters and U.S. Ser. No. 179,311. The masks are applied at an angle with respect to each other (e.g. orthogonally), so that the intersection of the masks defines the junction area. Each mask is preferably a narrow-line mask having a precisely controlled width. Thus, the intersection of two masks disposed at an angle with respect to each other will precisely define the lateral dimensions of a junction. The narrow-line mask are preferably derived utilizing "edge" lithography from a precise vertical dimension.

DESCRIPTION OF THE PREFERRED EMBODIMENT

Figure 1A:
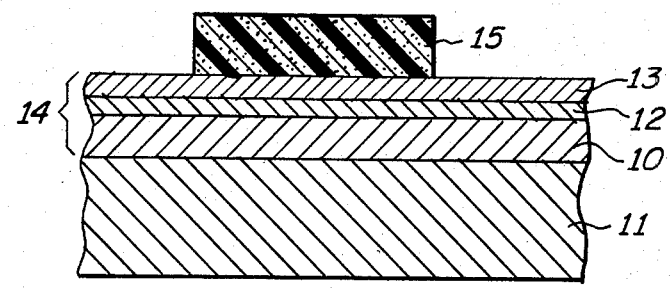
FIGS. 1a–1c are side-elevation views in cross-section depicting steps in the process of said U.S. Ser. No. 179,311 informing a superconductive junction

Referring to FIGS. 1a–1d, the steps in forming a superconductive tunnel junction in accordance with the method of said U.S. Ser. No. 179,311 and said Applied Physics Letters are delineated. FIG. 1a illustrates a layer 10 of superconductive material formed on a substrate 11. A barrier layer 12 is formed superposed on the layer 10. A second layer 13 of superconductive material is formed superposed on the barrier layer 12. The layers 10, 12 and 13 form a tri-layer sandwich, 14 of superconductor-barrier-superconductor. The sandwich structure 14 on the substrate 11 is preferably formed in situ in the same vacuum system pump down of preferably refractory materials as described in said Ser. No. 179,311. For example, the superconductive layers 10 and 13 may comprise niobium with the barrier 12 comprising a semi-conductor material such as silicon, germanium or alloys thereof. Specifically, the semi-conductor barrier material may be hydrogenated and amorphous or alternatively poly-crystalline. Such barrier materials are disclosed in Applicant's assignee's U.S. Pat. Nos. 4,176,365 and 4,220,959. Alternatively, the barrier may comprise a native oxide such as niobium oxide ($Nb_2O_5$).

Figure 1B:
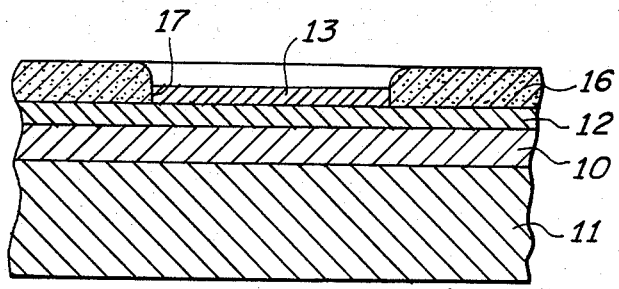

As described in said Ser. No. 179,311 and in said Applied Physics Letters, portions of the sandwich 14 where tunnel junctions are to be formed, are protected with a mask 15 and the unprotected portions of the layer 13 converted to insulating material. After the conversion to insulation, the mask 15 is stripped from the sandwich 14. FIG. 1b illustrates these steps where the portion of the layer 13 converted to insulation is depicted at 16. A junction having an area defined by the area of the mask 15 is thus formed having a perimeter 17. The insulation 16 is preferably an oxide of the superconductive material of the layer 13. When niobium is utilized as the superconductive layer 13, the insulator 16 is niobium oxide. As described in said U.S. Ser. No.

179,311 and in said Applied Physics Letters, the barrier layer 12 may also be converted to insulation through part or all of its thickness underlying the insulation 16. The mask 15 may comprise photoresistive material or may comprise an insulator such as silicon dioxide (SiO$_2$). The exposed portions of the layer 13 are converted to insulation preferably by anodization or oxidation.

It is appreciated that the area of the mask 15 determines the area of the formed junction and that the dimensional accuracy and uniformity of junctions formed on a chip depend on the dimensional accuracy and reproducibility of the planar lithographic processing of the mask 15. Additionally, the lower limit on the size of junctions obtainable by the process also depend, inter alia, on the dimensional limitations of the planar lithography applied to the mask 15.

Figure 1C:
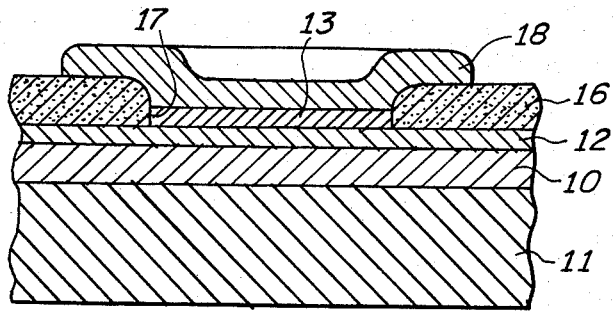
Figure 1D:
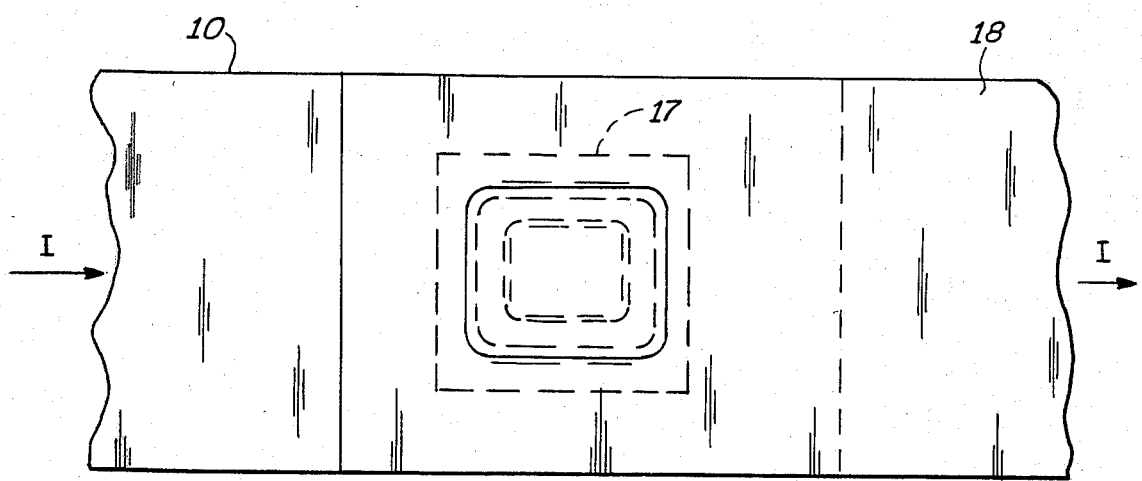
FIG. 1d is a plan view of the device of FIG. 1c.

Referring to FIG. 1c, contact to the upper superconductive electrode 13 is effected by a superconductive layer 18 formed over the layer 13 and the insulation 16. FIG. 1d is a plan view of the device depicted in FIG. 1c, where it is observed that the junction area defined by the mask 15 has a square shape perimeter 17. It is appreciated that the square-shaped junction is illustrated by way of example, other junction shapes being usable in practicing the present invention.

Referring to FIGS. 2a-2c and FIG. 3, steps in performing the method of the present invention are illustrated. Basically, the invention involves repeating a plurality of times, the conversion to insulation procedure of the layer 13 (FIG. 1a) of the process delineated in said U.S. Ser. No. 179,311. The junction area is defined by the intersection of the areas common to the individual patterns. Preferably, the individual patterns comprise narrow-line patterns with precise widths applied at angles with respect to each other in order to define junction areas with sides corresponding to the precise widths of the individual lines. For example, two-line patterns applied sequentially at a right angle with respect to each other, defines a rectangular junction. If the two-line patterns have equal widths, the junction will be square. Since the widths of the line patterns may be formed precisely and reproducibly in a manner to be described, the resulting junction areas enjoy concomitant dimensional accuracy, uniformity and reproducibility. Additionally, the narrow-line patterns can be formed with widths herein before unobtainable with precision, uniformity and reproducibility utilizing standard planar lithography.

Procedures are known for forming narrow lines (approximately 0.01 micron to 5 micron) where the width thereof is derived from a vertical dimension such as the thickness of a deposited film. The width of these lines are controllable with great precision. Uniform lines having widths of several hundred angstrom units have been achieved. Such lines are preferably formed in metal. Procedures for forming such lines will be described herein below. Details of such procedures may be found in publications such as Applied Physics Letters, Volume 37, No. 1, July 1, 1980, page 94 "Fabrication of 300 Angstrom Unit Metal Lines with Substrate-Step Techniques" by D. Prober, Feuer, and N. Giordano; Journal of Vacuum Science Technology, Volume 19, No. 4, November/December, 1981, page 892, "Application of 100 Angstrom Unit Line Width Structures Fabricated by Shadowing Techniques" by D. Flanders and A. White; and VLSI Electronics: Microstructure Science, Volume 5, Academic Press, 1982, Chapter 4 "Nanometer-Scale Fabrication Techniques" by R. Howard and D. Prober.

Such a precisely defined line can be transferred onto, for example, a silicon dioxide (SiO$_2$) film with high accuracy by, for example, ion milling or reactive ion etching. The resultant silicon dioxide line mask is then utilized as one of the junction-forming anodization masks in the repeated application of the process of said U.S. Ser. No. 179,311. By repeating the anodization with a second silicon dioxide line mask, at, for example, right angles to the first, a rectangular or square junction results whose sides correspond to the widths of the two silicon dioxide lines. This plural-step procedure results in junctions with areas extremely well controlled and with excellent uniformity. Additionally, very small junctions may be produced in this manner. The generation of fine lines of precise widths utilizing the techniques delineated in the above referenced articles, where the width of the resulting line is derived from a vertical dimension such as the thickness of a deposited film, is denoted as "edge lithography".

Figure 2A:
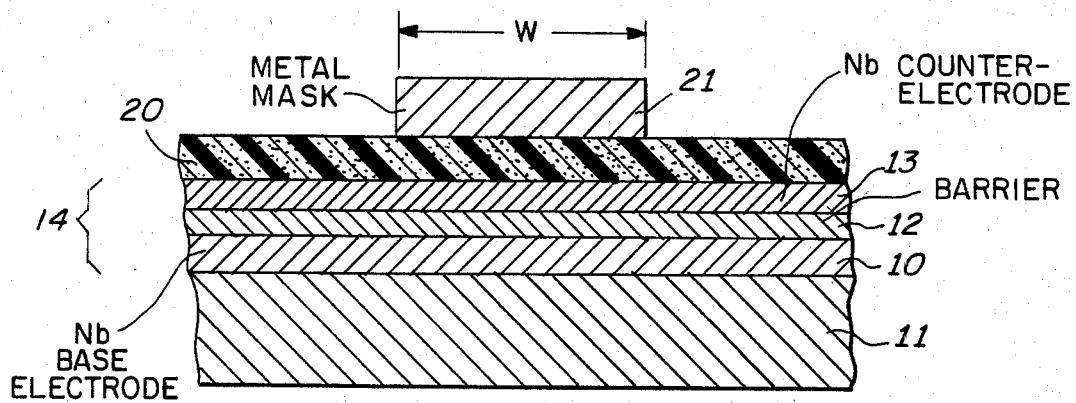
FIGS. 2a–2c are side-elevational views in cross-section depicting using the process of said U.S. Ser. No. 179,311 with a narrow-line mask formed from a metal mask in accordance with one step of the present invention.

Referring to FIG. 2a, the sandwich 14 discussed above with respect to FIG. 1a is illustrated with a layer 20 formed thereon which will become one of the anodization masks utilized in practicing the present invention. The layer 20 is preferably an insulator such as silicon dioxide. A think line metal mask 21 of width w is formed on the surface of the layer 20 utilizing edge lithography. The line mask 21, may, for example, have a width of between 0.1 micron and 5 micron to form a small precise junction.

Figure 2B:
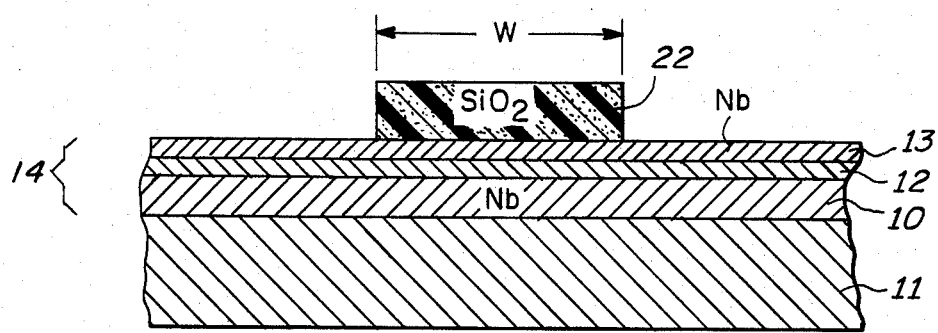
Figure 3:
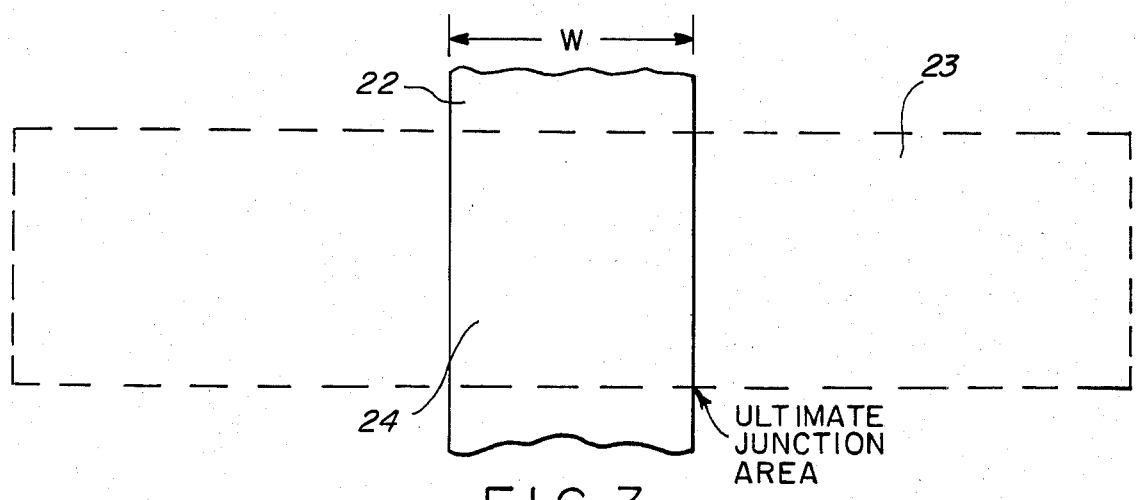
FIG. 3 is a plan view schematically illustrating the overlapping utilization of narrow-line masks to define a junction area in accordance with the invention.

The pattern of the metal mask 21 is then transferred from metal to the silicon dioxide layer. FIG. 2b illustrates this step where the resultant silicon dioxide fine-line mask is depicted at 22. A plan view of the mask 22 is illustrated in FIG. 3. The pattern of the metal mask 21 (FIG. 2a) may be transferred to the silicon dioxide mask 22 with high accuracy by ion milling or reactive ion etching.

Silicon dioxide mask 22 is utilized as the anodization or oxidation mask to define a junction in accordance with the procedures delineated in said Ser. No. 179,311. The resulting structure is illustrated in FIG. 2c, where the width of the junction is precisely controlled, but the junction has a length indicated by the length of the mask 22 in the plan view of FIG. 3.

Figure 2C:
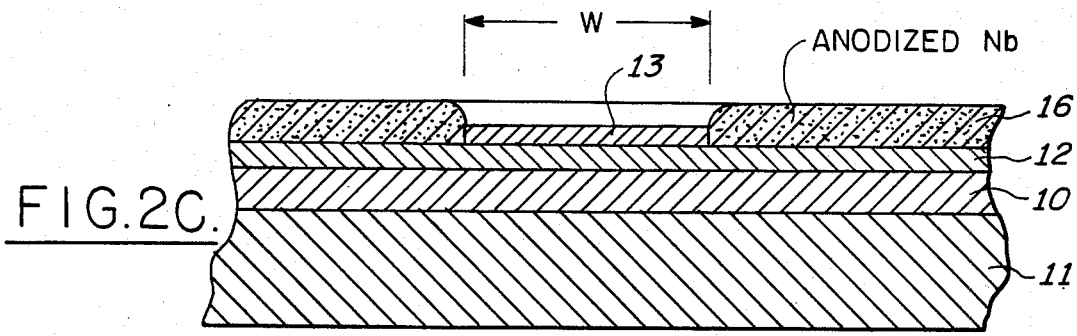

The above delineated steps described with respect to FIGS. 2a-c, are repeated with a further mask which again is preferably metal, oriented at an angle from the first mask. FIG. 3 illustrates such further mask at 23 oriented at 90° with respect to the first mask to form a junction area at 24. It is clear from FIG. 3 that the ultimate junction area does not substantially depend on the precision of the photoresist alignment.

Referring to FIGS. 4a-4e, a preferred method of utilizing edge lithography to generate a long mask in metal having a width from approximately 0.1 micron to 5 microns is illustrated. The method is utilized to generate the mask 22 of FIGS. 2b and 3.

Figure 4A:
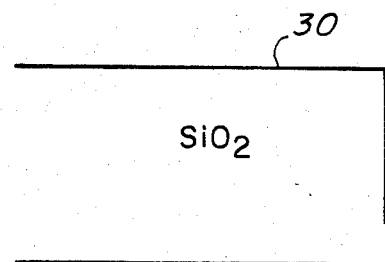
FIGS. 4a–4e are side elevation views depicting steps of a preferred method for forming the narrow-line masks of the present invention.

Referring to FIG. 4a, a relatively thick layer 30 of silicon dioxide or other suitable material is deposited on the tri-layer 14 by, for example, sputter deposition. Utilizing a photoresistive mask (not shown) a step 31 is etched into the film 30 by, for example, reactive sputter etching. The depth of the step 31 is not critical but preferably should be comparable to the width w of the desired junction. The silicon dioxide layer 30 is not etched completely through. After the etching procedure, the photoresistive mask that defined the step 31 is removed.

Figure 4B:
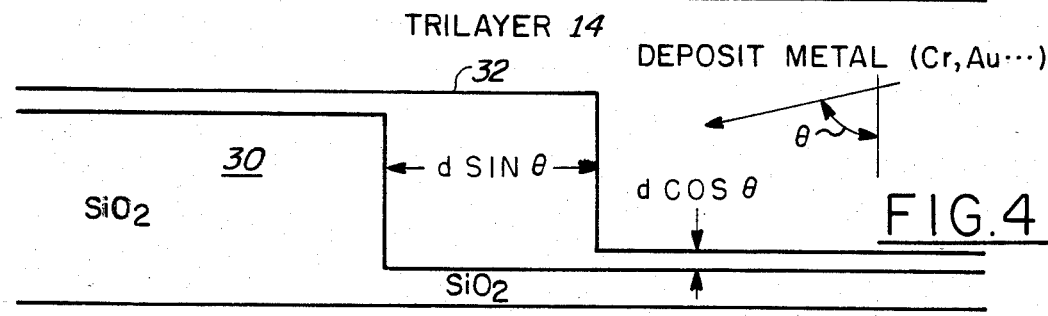

Referring to FIG. 4b, a metal film 32 such as chromium or gold is deposited at an oblique angle $\theta$ to the normal to the tri-layer 14 so that the film 32 covers the etched step in the layer 30. The angle $\theta$ may be approximately 80°. if d is the thickness that the metal film 32 would have were $\theta$ equal 0°, then d sin $\theta$ is the thickness of the film on the step edge. This thickness d sin $\theta$=w, the width of the desired line.

Figure 4C:
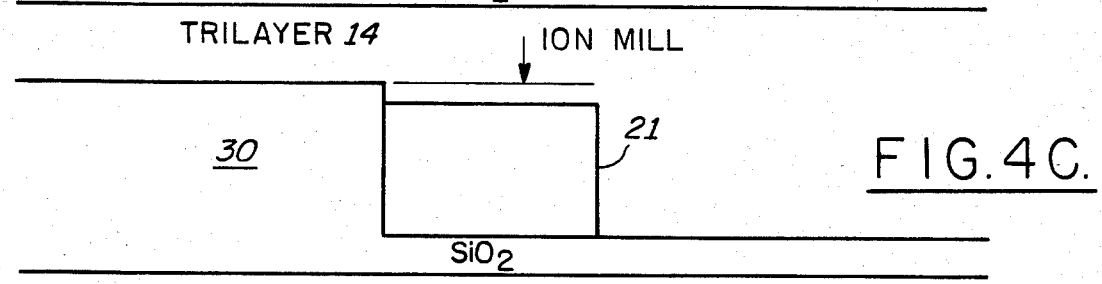

Referring to FIG. 4c, the metal from the flat regions of the layer 30 is removed utilizing, for example, an anisotropic etch such as by ion milling so that the width w=d sin $\theta$ of the metal is not substantially changed. This step forms the metal mask 21 (FIG. 2a) that will be used to pattern the silicon dioxide.

Figure 4D:
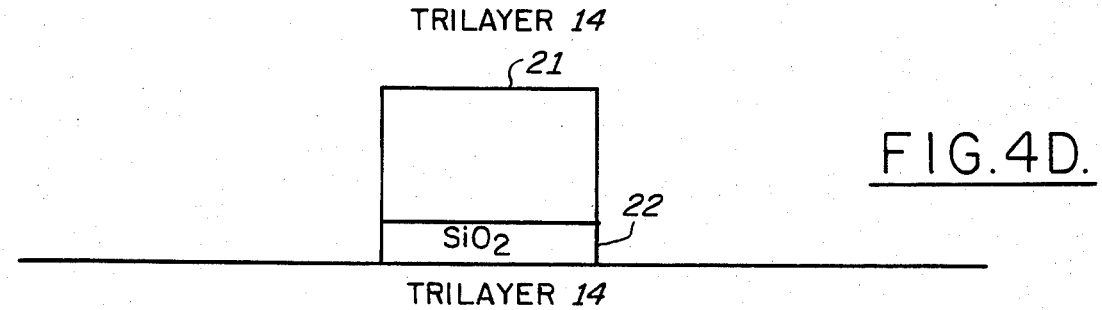
Figure 4E:
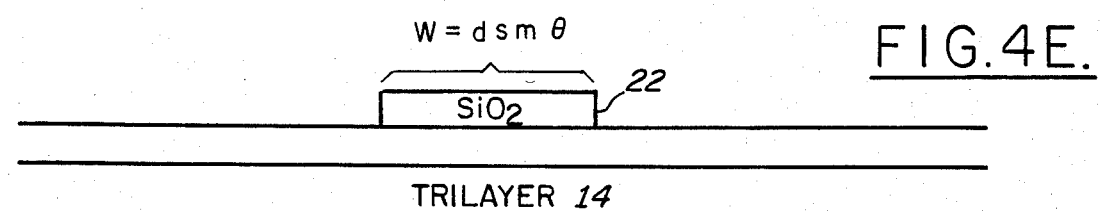

FIG. 4d, illustrates the step of removing all of the silicon dioxide not protected by the metal mask 21. A reactive sputter etch may be utilized in the SiO$_2$ removal. FIG. 4e depicts the step of removing the metal mask 21. The mask 21 may be removed by any wet or dry selective etching technique. The step depicted in FIG. 4e results in the silicon dioxide line mask 22 of width w=d sin $\theta$ which will be utilized for the anodization discussed above with respect to FIGS. 2b and 2c.

Figure 5A:
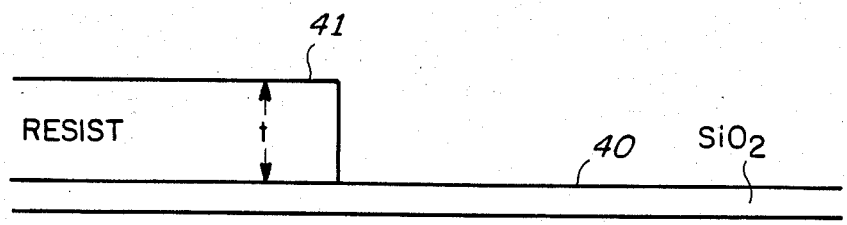
FIGS. 5a–5d are side elevation views depicting an alternate method for forming the narrow-line masks of the present invention.
Figure 5B:
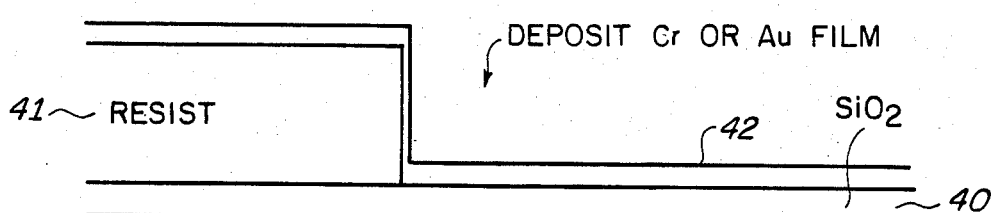
Figure 5C:
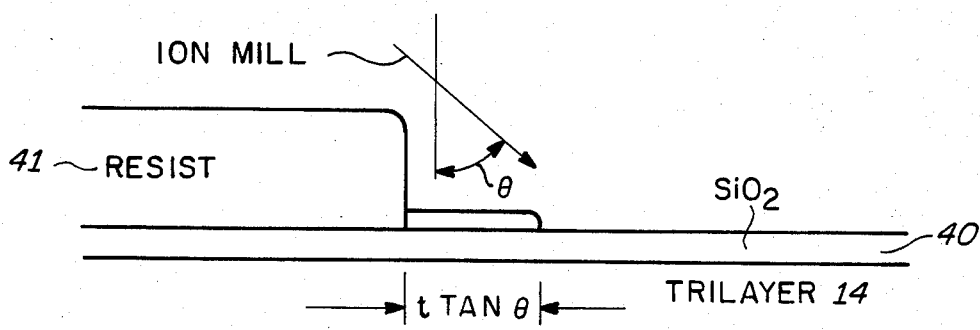
Figure 5D:
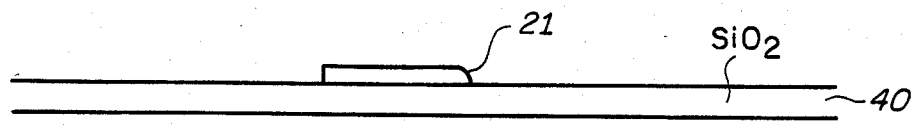

Referring to FIGS. 5a-5d, an alternative method for forming the narrow-line mask utilizing edge lithography is illustrated. In FIG. 5a, a layer 40 comprising, for example, silicon dioxide is formed on the tri-layer 14. The layer 40 will provide the anodization mask 22 (FIG. 2b). A thick photoresist film 41 (thickness t) is patterned on the layer 40. The layer 41 may alternatively comprise polymide or other suitable material. FIG. 5b illustrates depositing a metal film 42 such as chromium, gold or the like over the layers 40 and 41 at an angle substantially normal to the layer 40 or at a small angle with respect to the normal so as to assure that the metal film will uniformly cover the layer 40 up to the step formed by the resist layer 41. FIG. 5c illustrates removing the metal film from the flat surfaces of the layers 40 and 41 except where the metal film is shadowed by the resist layer. Ion milling may be utilized during this step. A second milling step may be utilized to remove the metal from the sidewall of the resist layer 41. If $\theta$ is the angle from the normal of the milling process, then the width of the metal remaining on the layer 40 has a width w=t tan $\theta$. FIG. 5d illustrates stripping the resist 41 leaving the metal mask 21. Steps similar to those described above with respect to FIGS. 4c-4e may be utilized to complete the silicon dioxide narrow-line mask to be used in the anodization process as described above.

The procedure illustrated in FIGS. 4a-4e may have advantages over the procedure of FIGS. 5a-5d in that the procedure of FIGS. 4a-4e may be less sensitive to $\theta$ and may be less sensitive to the formation of a rounded step profile as illustrated in FIG. 5c. The procedure of FIGS. 4a-4e is also easier to implement than that of FIGS. 5a-5d.

Figure 6A:
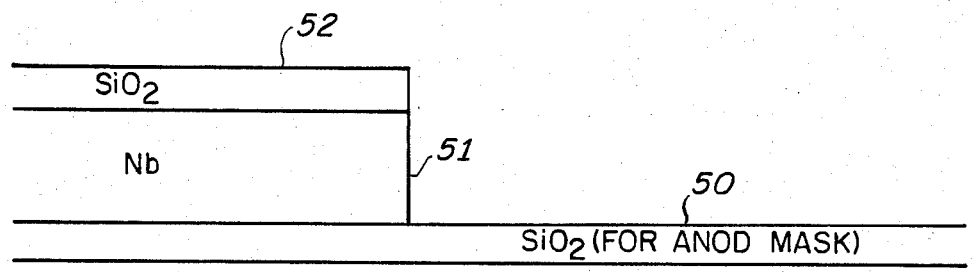
FIGS. 6a–6b are side elevation views depicting the steps of a further alternate method of forming the narrow-line masks of the present invention.
Figure 6B:
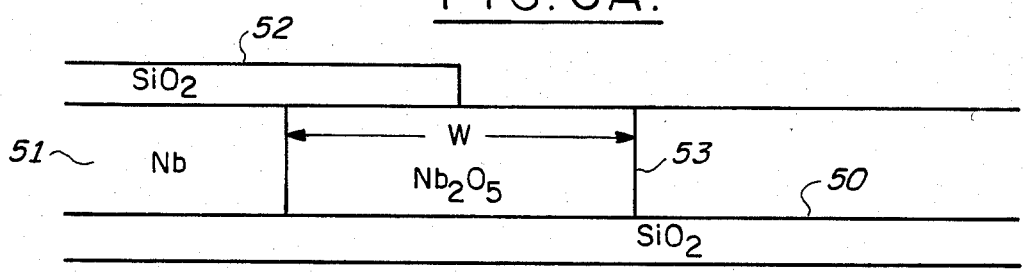

Referring to FIGS. 6a and 6b, a further alternative method for forming the narrow-line anodization mask 22 of FIG. 2b, is illustrated. A layer 50, for example, comprising silicon dioxide, is formed on the tri-layer 14 for providing the anodization mask. FIG. 6a illustrates a patterned layer 51 of an anodizable metal such as niobium formed on the layer 50. The upper surface of the niobium layer 51 is protected by a layer 52 of a suitable material such as silicon dioxide. The exposed edges of the layers 51 and 52 may be formed by etching or step, as shown, in the layers using a photoresist mask. FIG. 6b illustrates anodizing the exposed edges of the niobium layer 51 to form a native oxide strip 53 of width w. Very precise control of the width w is obtained by controlling the anodization voltage. The next step is to selectively remove the silicon dioxide layer 52 and the niobium 51 leaving the niobium oxide strip 53 as an etch mask for the silicon dioxide layer 50. In this manner, the silicon dioxide anodization mask discussed above with respect to FIG. 2b is provided. Alternatively, the anodization step forming the strip 53 may be replaced with an electroplating step so as to form a film on the edge of the niobium layer 51 of precise width w.

It is appreciated from the foregoing that compared with standard planar lithography, the present invention provides a significant improvement in junction area uniformity. Lateral dimensions of superconductive junctions are derived from a film thickness or a film thickness and an angle which parameters are controllable to a high degree of uniformity and accuracy. The multiple step process of the present invention combines the benefits of the method of said Ser. No. 179,311 with edge lithography in order to achieve accurate and uniform area control of small as well as large Josephson junctions.

Figure 7A:
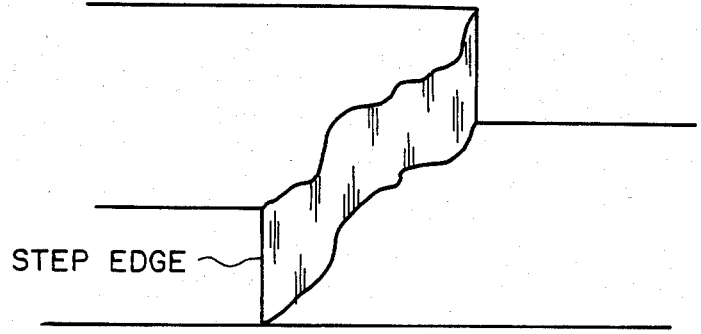
FIGS. 7a–7b are views illustrating area constancy of the present invention in the presence of unevenly edged masks.
Figure 7B:
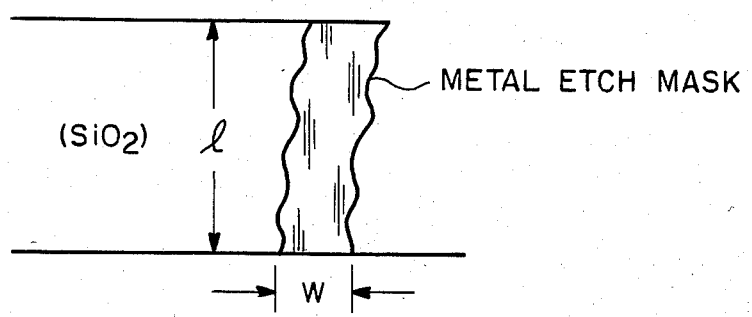

The present invention provides planar superconductive junctions as contrasted with the edge junction technology. The edge junction techniques are described in Applied Physics Letters, Volume 37 No. 2, July 15, 1980, page 237, "Josephson's Junctions of Small Area Formed on Edges of Niobium Films" by R. Broom, A. Oosenburg and W. Walter; Applied Physics Letters, Volume 35, No. 11, Dec. 1, 1979, page 879, "Small-area High Current Density Josephson Junctions: by R. Howard, E. Hu, L. Jackel, L. Fetter and R. Bosworth, and IEEE Transactions on Magnetics, Vol. Mag-17, No. 1, January 1981, "Submicron Niobium Tunnel Junctions with Reactive Ion Beam Oxidation" by A. Kleinsasser, B. Hunt, A. Callegari, C. Rogers, R. Tiberio and R. Buhrman. In the edge junctions technology, only a single junction dimension is controlled by a vertical thickness whereas in the present invention, all of the dimensions of the junction perimeter are precisely controlled by the vertical thickness. It is appreciated that in edge junctions, the junction area depends on the total length of the edge including uneven undulations or wiggles of the edge. It is appreciated from FIGS. 7a and 7b that the unevenness of the edge of the film utilized to define the metal etch mask may reflect in concomitant unevenness of the edges of the mask. However, in the present invention, the area equal to w $\times$ l is independent of the wiggles. This is evident in FIGS. 7b which is a top view of the structures delineated in any of the figures discussed above, where l is the straight line distance in the direction perpendicular to the angle of the evaporative deposition of the metal.

The present invention can be combined with a conventional utilization of the method of said U.S. Ser. No. 179,311 in the junctions utilizing the multiple step process of the present invention may be formed on the same substrate with junctions formed utilizing the single step lithography of said Ser. No. 179,311. This may be achieved by the addition of a further anodization step providing all junction areas are common to all masks. For example, conventionally defined large-area junctions can first be fabricated using the previously disclosed process. In this first step, the areas intended for the two-step process are also protected during the first anodization step. Following this step, the procedures outlined herein are followed with one addition: after the formation of the SiO$_2$ line mask, but before the anodization step, the conventionally formed large area junctions are protected by applying and patterning a photoresist mask which completely overlaps them. Thus, it is clear that junctions of varying size can be fabricated at the expense of additional processing steps. In the edge junction technology, planar junctions can be formed on the same substrate with edge junctions, but disparate parameters are obtained between the planar and edge junctions. For example, different current densities are experienced with respect to the two types of junctions. In the present invention, and in said Ser. No. 179,311, all junctions are planar and therefore greater uniformity of parameters are obtainable.

The two-step process of the present invention may, for example, be advantageously combined with the conventional utilization of the method of Ser. No. 179,311 in a memory chip where a large number of small-size uniform memory cell junctions may be formed utilizing the present process but the driving circuits at the periphery of the chip requiring large area junctions may be fabricated utilizing the conventional application of said Ser. No. 179,311.

Although the best mode of practicing the present invention was exemplified in terms of a superconductive tunnel junction integrated circuit utilizing the method of said U.S. Ser. No. 179,311, it is appreciated that the present invention is applicable generally to integrated circuits utilizing processes different from those described in said Ser. No. 179,311. For example, the present invention is applicable to processing semiconductor integrated circuits as well as superconductive devices. The invention is applicable to any subtractive processing such as, for example, subtractive etching. The selective conversion to insulation of a superconductive metal layer of U.S. Ser. No. 179,311 is a subtractive process. Generally, the invention is a method of defining an area on a layer of an integrated circuit. The layer may comprise superconductive, semiconductive, conductive or insulative material. The area is defined by the intersection of the plural narrow-line masks. The unmasked regions are subtractively rendered ineffective by such treatments or alterations of the material of the layer such as anodization, oxidation, etching, passivation, diffusion, ion implantation and the like.

While the invention has been described in its preferred embodiments, it is to be understood that the words which have been used are words of description rather than of limitation and that changes may be made within the purview of the appended claims without departing from the true scope and spirit of the invention in its broader aspects.

I claim:

1. A method of defining an area on a layer of an integrated circuit comprising the steps of
   masking a first region of said layer with a said first narrow-line mask,
   subtractively rendering ineffective unmasked regions of said layer,
   removing said first mask,
   applying a second narrow-line mask to said layer intersecting said first region at an angle with respect thereto, and
   subtractively rendering ineffective unmasked and effective regions of said layer,
   so as to define said area on said layer by the intersection of said first and second masks.

2. The method of claim 1 in which said layer comprises a layer of superconductive material and said step of subtractively rendering ineffective comprises the step of converting unmasked regions of said layer of superconductive material to an insulating material through the entire thickness thereof.

3. A method of defining the area of a superconductive tunnel junction comprising the steps of
   forming a first layer of superconductive material on a substrate,
   forming a barrier layer of barrier material on said first layer,
   forming a second layer of superconductive material on said barrier layer,
   masking a first region of said second layer with a first narrow-line mask,
   converting unmasked regions of said second layer of superconductive material to an insulating material through the entire thickness thereof,
   removing said first mask,
   applying a second narrow-line mask to said second layer intersecting said first region at an angle with respect thereto, and
   converting unmasked and unconverted regions of said second layer of superconductive material to an insulating material through the entire thickness thereof,
   said first layer remaining substantially unconverted to insulating material during said conversion steps.

4. The method of claim 3 in which said masking step comprises the steps of
   forming a layer of masking material on said second layer,
   forming a narrow-line metal mask on said layer of masking material, and
   transferring said metal mask to said layer of masking material to provide said narrow-line mask.

5. The method of claim 4 in which said masking material comprises insulation.

6. The method of claim 5 in which said insulation comprises silicon dioxide.

7. The method of claim 3 in which said masking step comprises the steps of
   forming a layer of masking material on said second layer of superconductive material,
   forming a step in said layer of masking material,
   depositing a layer of metal on said layer of masking material at an oblique angle to the normal of said layer of masking material to cover the step therein so as to form a narrow line metal mask at the vertical wall of said step,
   removing the flat regions of said layer of metal leaving said narrow line metal mask at said step edge,
   removing said layer of masking material not covered by said narrow line metal mask, and
   removing said narrow line metal mask from said covered masking material.

8. The method of claim 7 in which said masking material comprises insulation.

9. The method of claim 8 in which said insulation comprises silicon dioxide.

10. The method of claim 7 in which said step of forming a step in said layer of masking material comprises etching said step therein.

11. The method of claim 10 in which said etching comprises reactive sputter etching.

12. The method of claim 7 in which said step of depositing a layer of metal comprises depositing said metal at said oblique angle so that said step edge is covered to a width equal to the sine of said oblique angle times the thickness said layer of metal would have were said oblique angle equal to zero.

13. The method of claim 12 in which said step of removing said metal from said flat regions comprises removing said metal by an anisotropic etch so that said width is not substantially altered.

14. The method of claim 13 in which said anisotropic etch comprises ion milling.

15. The method of claim 7 in which said step of removing said masking material comprises removing said masking material by reactive sputter etching.

16. The method of claim 7 in which said step of removing said narrow-line metal mask comprises removing said narrow-line metal mask by selective etching.

17. The method of claim 3 in which said masking step comprises the steps of forming a layer of masking material on said second layer of superconductive material, forming a shadowing layer with respect to said layer of masking material to provide a shadowing step, depositing a layer of metal on said shadowing layer and said layer of masking material at an angle substantially normal to said layer of masking material, anisotropically etching said layer of metal at an oblique angle to the normal of said layer of masking material so that said shadowing steps shadows said layer of metal to form a narrow-line metal mask at said shadowing step, removing said shadowing layer, removing said layer of masking material not covered by said narrow-line metal mask, and removing said narrow line metal mask from said covered masking material.

18. The method of claim 17 in which said masking material comprises insulation.

19. The method of claim 18 iun which said insulation comprises silicon dioxide.

20. The method of claim 17 in which said shadowing layer comprises photoresistive material.

21. The method of claim 20 in which said photoresistive material comprises polyimide.

22. The method of claim 17 in which said anisotropic etch comprises ion milling.

23. The method of claim 17 in which the width of said narrow-line metal mask comprises the thickness of said shadowing layer times the tangent of said oblique angle.

24. The method of claim 3 in which said masking step comprises the steps of forming a layer of masking material on said second layer of superconductive material, depositing a layer of metal on said layer of masking material, forming a protective layer on said layer of metal, forming a step in said metal and protective layers leaving an exposed metal edge, oxidizing said edge of said layer of metal to form a narrow-line etch mask, removing said protective layer and said layer of metal not converted to said etch mask, removing said layer of masking material not covered by said etch mask, and removing said etch mask.

25. The method of claim 24 in which said masking material comprises insulation.

26. The method of claim 25 in which said insulation comprises silicon dioxide.

27. The method of claim 24 in which said metal comprises niobium and said etch mask comprises niobium oxide.

28. The method of claim 24 in which said protective layer comprises insulation.

29. The method of claim 28 in which said insulation comprises silicon dioxide.

30. The method of claim 24 in which said oxidation comprises anodization.

31. The method of claim 3 in which said masking step comprises the steps of forming a layer of masking material on said second layer of superconductive material, depositing a layer of metal on said layer of masking material, forming a protective layer on said layer of metal, forming a step in said metal and protective layers leaving an exposed metal edge, electroplating said edge to form a narrow-line etch mask, removing said protective layer and said layer of metal leaving said etch mask, removing said layer of masking material not covered by said etch mask, and removing said etch mask.

32. The method of claim 3 in which said converting step comprises converting at least a portion of the thickness of said barrier layer to an insulating material in alignment with and underlying the converted regions of said second layer of superconductive material.

33. The method of claim 3 including the further steps of applying further narrow-line masks to said second layer and converting unmasked and unconverted regions of said second layer to an insulating material through the entire thickness thereof, thereby defining the area of said tunnel junction.

34. The method of claim 3 in which at least one of said converting steps comprises converting by anodization.

35. The method of claim 3 in which at least one of said converting steps comprises converting by oxidation.

36. A method of defining the area of a superconductive tunnel junction and manufacturing a further superconductive tunnel junction comprising the steps of forming a first layer of superconductive material on a substrate, forming a barrier layer of barrier material on said first layer, forming a second layer of superconductive material on said barrier layer, masking an area of said second layer defining said further superconductive tunnel junction, protecting a predetermined section of said second layer with a protective mask, converting unmasked regions of said second layer of superconductive material to an insulating material through the entire thickness thereof, thereby manufacturing said further superconductive tunnel junction, removing said protective mask, protecting said further superconductive tunnel junction with a further protective mask, masking a first region in said predetermined section of said second layer with a first narrow-line mask, converting unmasked regions of said second layer of superconductive material to an insulating material through the entire thickness thereof, removing said first narrow-line mask, applying a second narrow-line mask to said predetermined section of said second layer intersecting said first region at an angle with respect thereto, and converting unmasked and unconverted regions of said second layer of superconductive material to an insulating material through the entire thickness thereof, thereby defining the area of said superconductive tunnel junction by the intersection of said first and second narrow-line masks.

* * * * *